United States Patent
Basker et al.

(10) Patent No.: US 10,090,197 B2
(45) Date of Patent: Oct. 2, 2018

(54) AGGRESSIVE TIP-TO-TIP SCALING USING SUBTRACTIVE INTEGRATION

(71) Applicant: International Business Machines Corporation, Armonk, NY (US)

(72) Inventors: Veeraraghavan S. Basker, Schenectady, NY (US); Wilfried E.-A. Haensch, Somers, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/681,552

(22) Filed: Aug. 21, 2017

(65) Prior Publication Data

US 2018/0005884 A1    Jan. 4, 2018

Related U.S. Application Data

(62) Division of application No. 15/201,490, filed on Jul. 3, 2016, now Pat. No. 9,793,160.

(51) Int. Cl.
| | |
|---|---|
| H01L 21/768 | (2006.01) |
| H01L 23/535 | (2006.01) |
| H01L 29/06 | (2006.01) |
| H01L 29/66 | (2006.01) |
| H01L 29/78 | (2006.01) |
| H01L 29/417 | (2006.01) |

(52) U.S. Cl.
CPC ...... *H01L 21/76895* (2013.01); *H01L 23/535* (2013.01); *H01L 29/0649* (2013.01); *H01L 29/41791* (2013.01); *H01L 29/66628* (2013.01); *H01L 29/66795* (2013.01); *H01L 29/785* (2013.01)

(58) Field of Classification Search
None
See application file for complete search history.

(56) References Cited

U.S. PATENT DOCUMENTS

| | | | | |
|---|---|---|---|---|
| 2015/0084134 A1* | 3/2015 | Lin | ............ | H01L 21/82343 257/384 |
| 2015/0091100 A1* | 4/2015 | Xie | ............ | H01L 21/76224 257/401 |

* cited by examiner

*Primary Examiner* — Khaja Ahmad
(74) *Attorney, Agent, or Firm* — Law Offices of Ira D. Blecker, P.C.

(57) ABSTRACT

An interconnect structure including a semiconductor structure on a semiconductor substrate, the semiconductor structure having a gate structure, shallow trench isolation and a source and a drain; a trench adjacent to the gate structure; a metal line adjacent to the gate structure and filling the trench, the metal line contacts one of the source and the drain; a gap in the metal line so as to create segments of the metal line; and a dielectric material filling the gap such that ends of the metal line abut the dielectric material wherein the ends of the metal line have a flat surface.

18 Claims, 10 Drawing Sheets

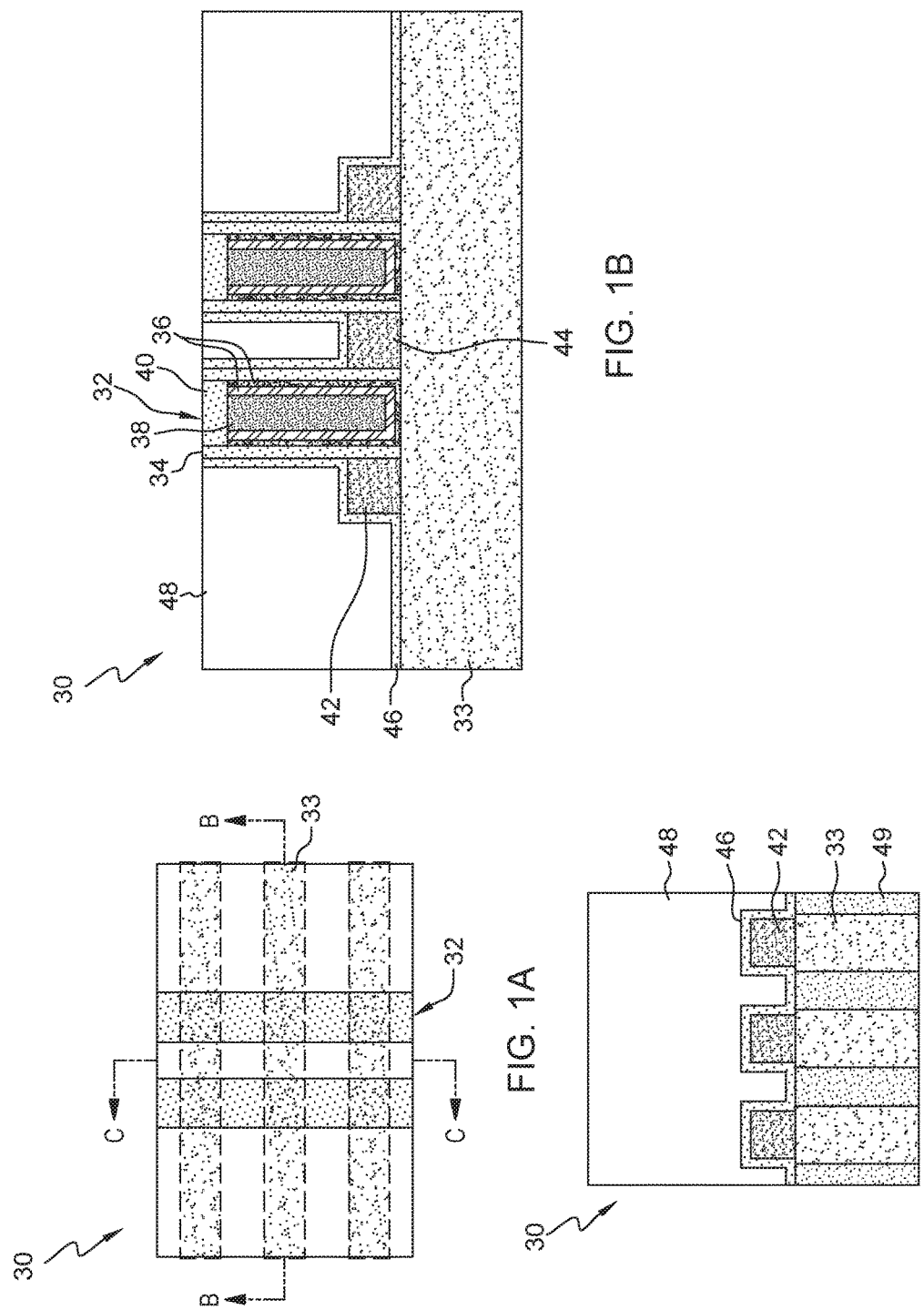

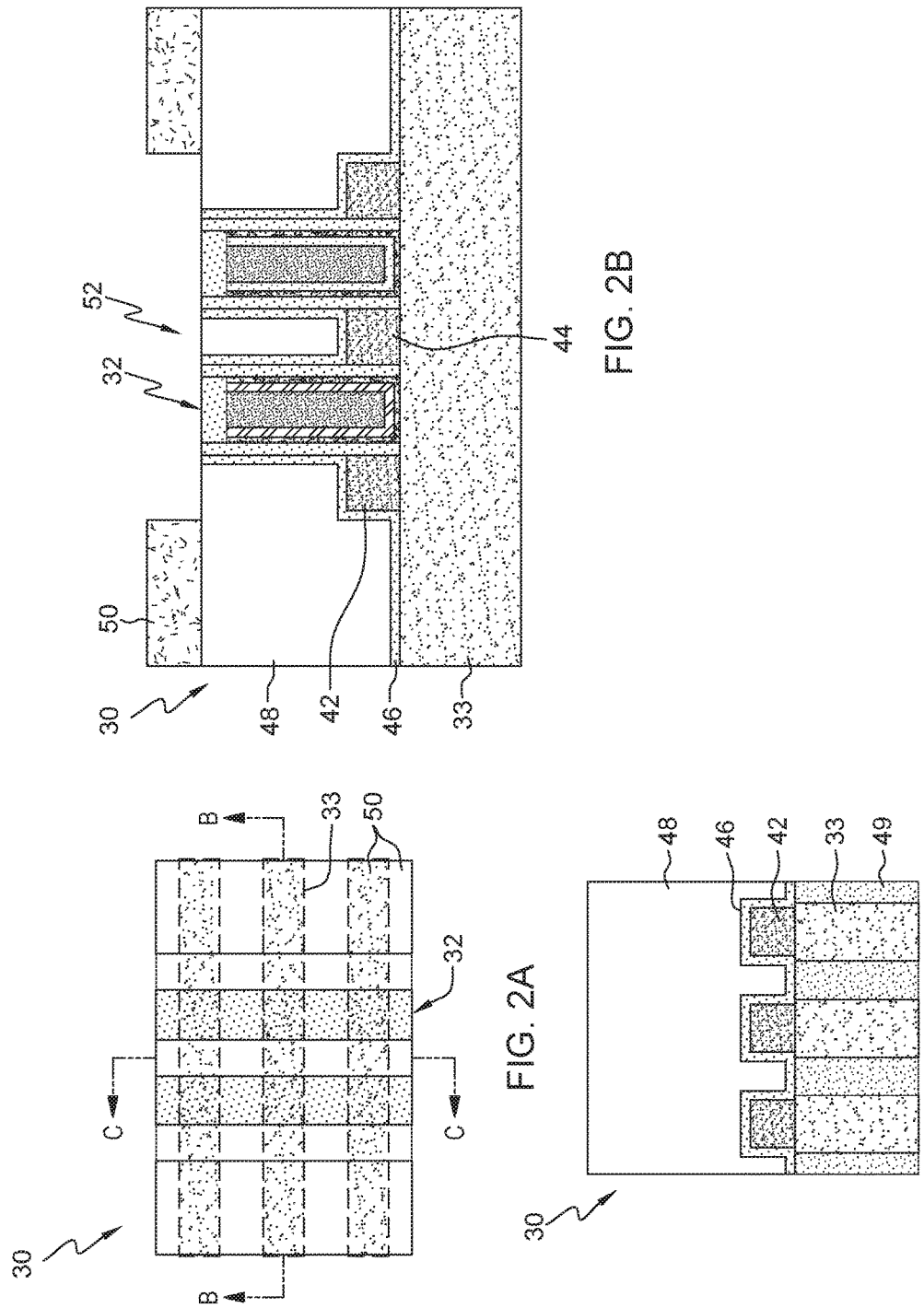

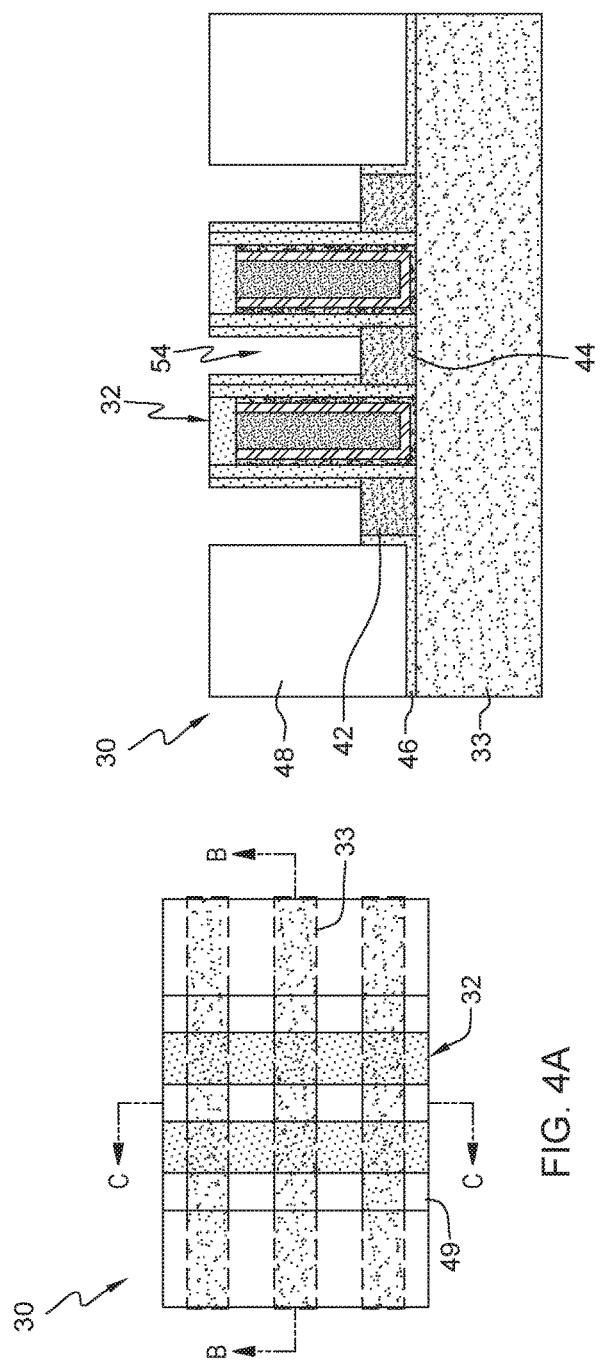

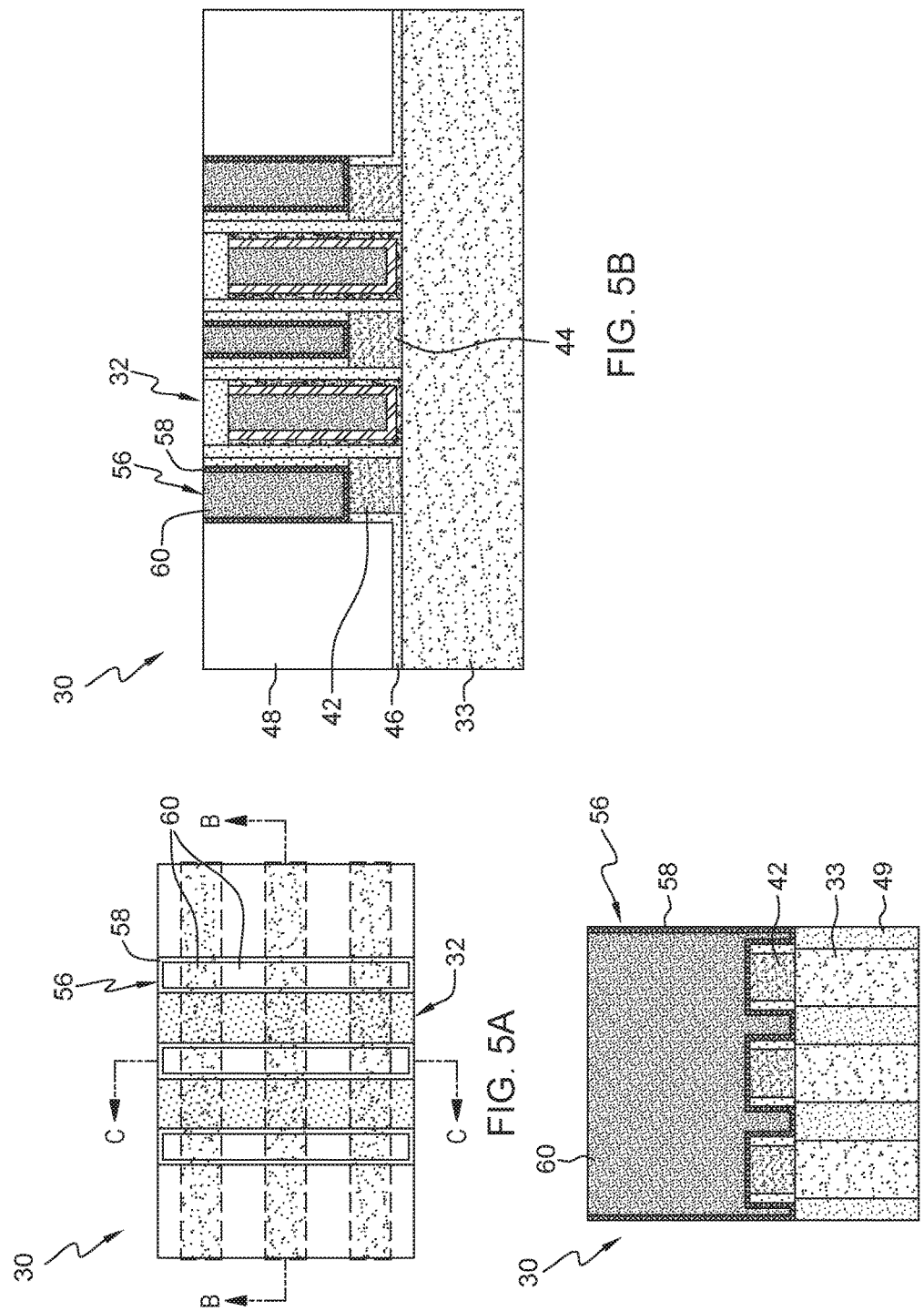

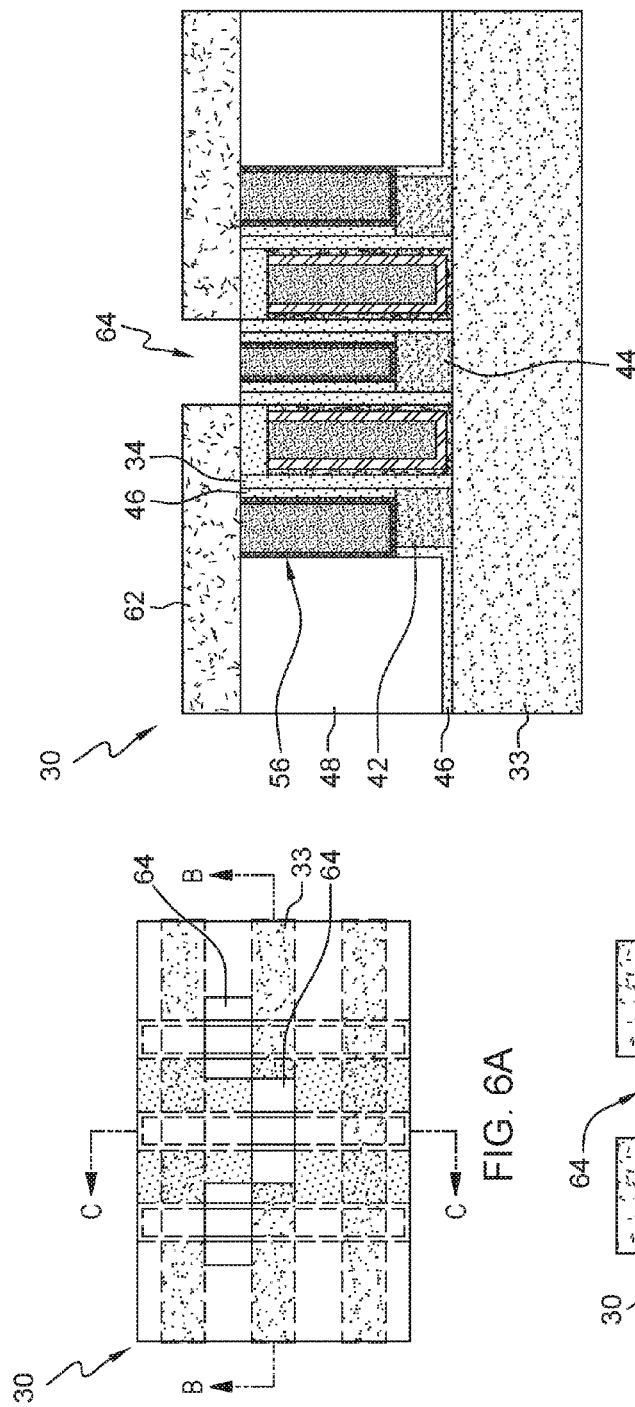
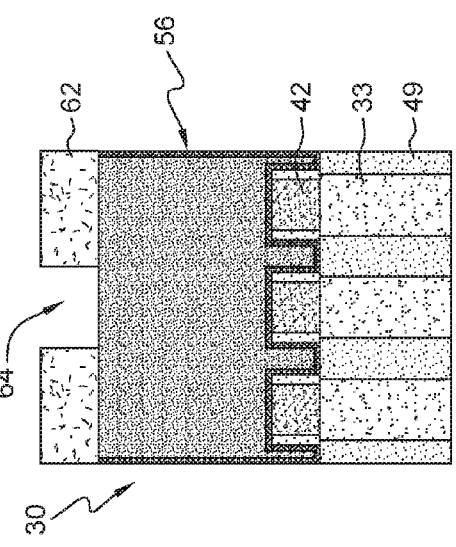
FIG. 6B
FIG. 6A
FIG. 6C

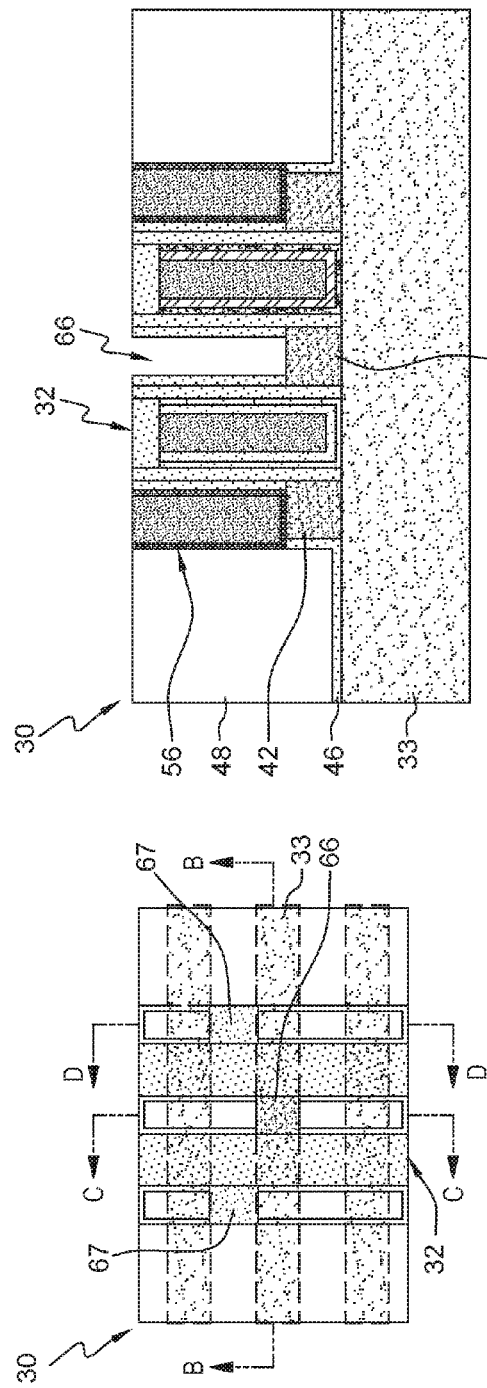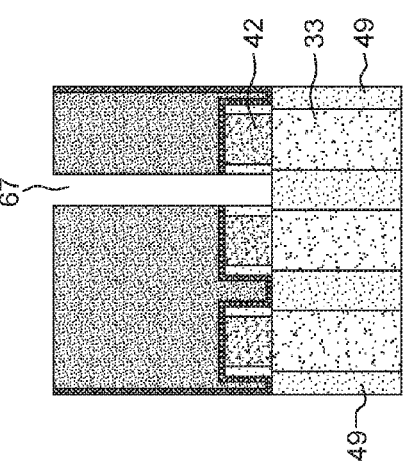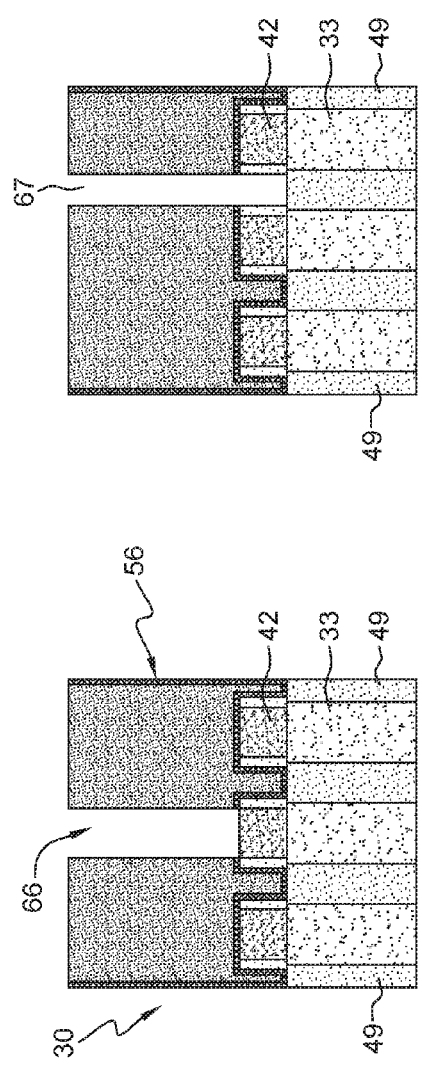

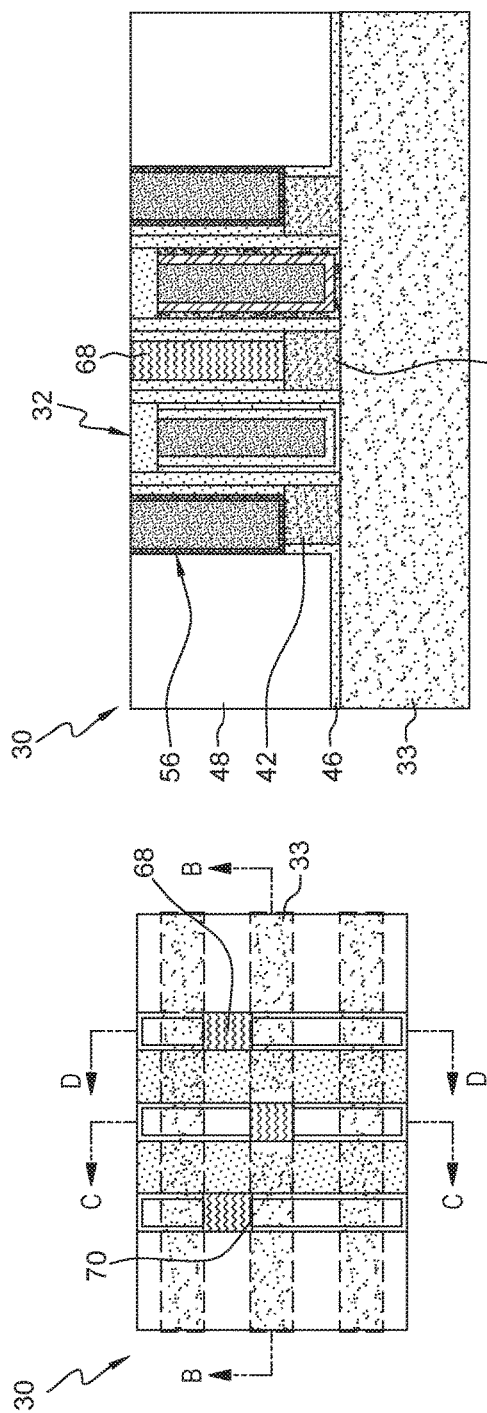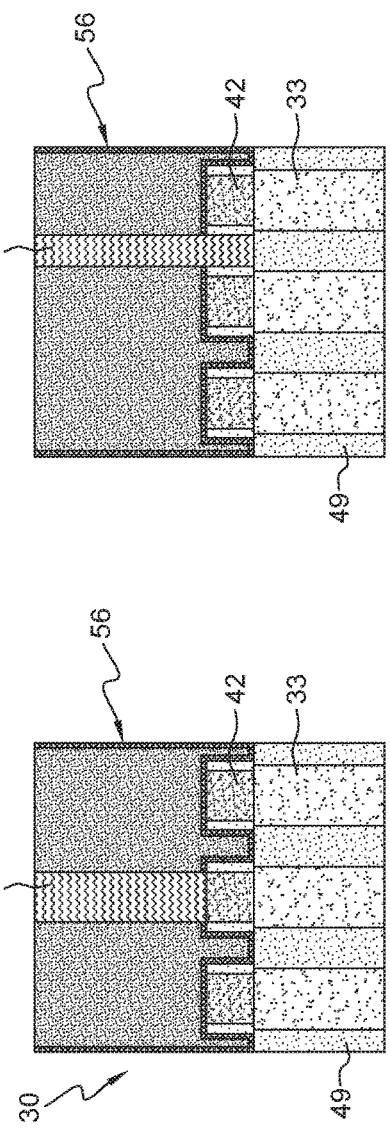

AGGRESSIVE TIP-TO-TIP SCALING USING SUBTRACTIVE INTEGRATION

BACKGROUND

The present exemplary embodiments pertain to semiconductor processing and, more particularly, pertain to exemplary embodiments of semiconductor processing in which there is aggressive tip-to-tip scaling using subtractive integration.

Semiconductor structures are being developed in which feature sizes are continually being decreased. The problems caused by tight tip-to-tip contact spacing are particularly severe in highly integrated circuits with the greatest demand for feature size reduction and scaling. Feature size reduction may be even more acute as feature size reduction approaches 10 nanometer (nm) and beyond.

BRIEF SUMMARY

The various advantages and purposes of the exemplary embodiments as described above and hereafter are achieved by providing, according to an aspect of the exemplary embodiments, an interconnect structure comprising: a semiconductor structure on a semiconductor substrate, the semiconductor structure having a gate structure, shallow trench isolation and a source and a drain; a trench adjacent to the gate structure; a metal line adjacent to the gate structure and filling the trench, the metal line contacts one of the source and the drain; a gap in the metal line so as to create segments of the metal line; and a dielectric material filling the gap such that ends of the metal line abut the dielectric material wherein the ends of the metal line have a flat surface.

According to another aspect of the exemplary embodiments, there is provided an interconnect structure comprising: a semiconductor structure on a semiconductor substrate, the semiconductor structure having a plurality of gate structures, shallow trench isolation separating the plurality of gate structures and each gate structure having a source and a drain; a trench adjacent to each of the plurality of gate structures; a metal line adjacent to each of the plurality of gate structures and filling the trench, the metal line contacts one of the source and the drain of the plurality of gate structures; a gap in each metal line so as to create segments of the each metal line; and a dielectric material filling the gap in each metal line such that ends of the each metal line abut the dielectric material wherein the ends of the each metal line have a flat surface.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

FIG. 1A is a plan view of a semiconductor structure having a plurality of fins and a plurality of gate structures, FIG. 1B is a cross sectional view of FIG. 1A in the direction of arrows B-B and FIG. 1C is a cross sectional view of FIG. 1A in the direction of arrows C-C.

FIG. 2A is a plan view of the semiconductor structure of FIG. 1A in which a photoresist has been applied and developed to create an opening over the plurality of gate structures, FIG. 2B is a cross sectional view of FIG. 2A in the direction of arrows B-B and FIG. 2C is a cross sectional view of FIG. 2A in the direction of arrows C-C.

FIG. 4A is a plan view of the semiconductor structure of FIG. 3A in which the photoresist has been removed from the semiconductor structure, FIG. 4B is a cross sectional view of FIG. 4A in the direction of arrows B-B and FIG. 4C is a cross sectional view of FIG. 4A in the direction of arrows C-C.

FIG. 5A is a plan view of the semiconductor structure of FIG. 4A in which the trenches created in FIGS. 3A, 3B and 3C have been filled with a metal material to create metal-filled lines, FIG. 5B is a cross sectional view of FIG. 5A in the direction of arrows B-B and FIG. 5C is a cross sectional view of FIG. 5A in the direction of arrows C-C.

FIG. 6A is a plan view of the semiconductor structure of FIG. 5A in which a photoresist has been applied and developed to create openings over the metal-filled lines, FIG. 6B is a cross sectional view of FIG. 6A in the direction of arrows B-B and FIG. 6C is a cross sectional view of FIG. 6A in the direction of arrows C-C.

FIG. 7A is a plan view of the semiconductor structure of FIG. 6A in which the metal-filled lines have been etched through the openings created in FIGS. 6A, 6B and 6C to create gaps in the metal-filled lines, FIG. 7B is a cross sectional view of FIG. 7A in the direction of arrows B-B, FIG. 7C is a cross sectional view of FIG. 7A in the direction of arrows C-C and FIG. 7D is a cross sectional view of FIG. 7A in the direction of arrows D-D.

FIG. 8A is a plan view of the semiconductor structure of FIG. 7A in which the gaps in the metal-filled lines created in FIGS. 7A, 7B and 7C have been filled with a dielectric material, FIG. 8B is a cross sectional view of FIG. 8A in the direction of arrows B-B, FIG. 8C is a cross sectional view of FIG. 8A in the direction of arrows C-C and FIG. 8D is sectional view of FIG. 8A in the direction of arrows D-D.

DETAILED DESCRIPTION

Referring to the Figures in more detail there is described a process by which tip-to-tip spacing of metal-filled lines may be accurately controlled for aggressive scaling of the ends of the metal-filled lines.

More particularly, the exemplary embodiments are directed to the first level after the front end of the line (FEOL). The FEOL is that portion of the semiconductor structure in which the transistors, capacitors and other devices are formed. The transistors have a source and a drain and it is necessary to have contacts that make physical and electrical contact with the source and drain. The metal-filled lines are used in the formation of the contacts. However, there needs to be a space between the metal-filled lines to avoid shorts. The exemplary embodiments pertain to a process of maintaining a very well defined spacing, so-call tip-to-tip spacing, between the metal-filled lines.

Figure 9:
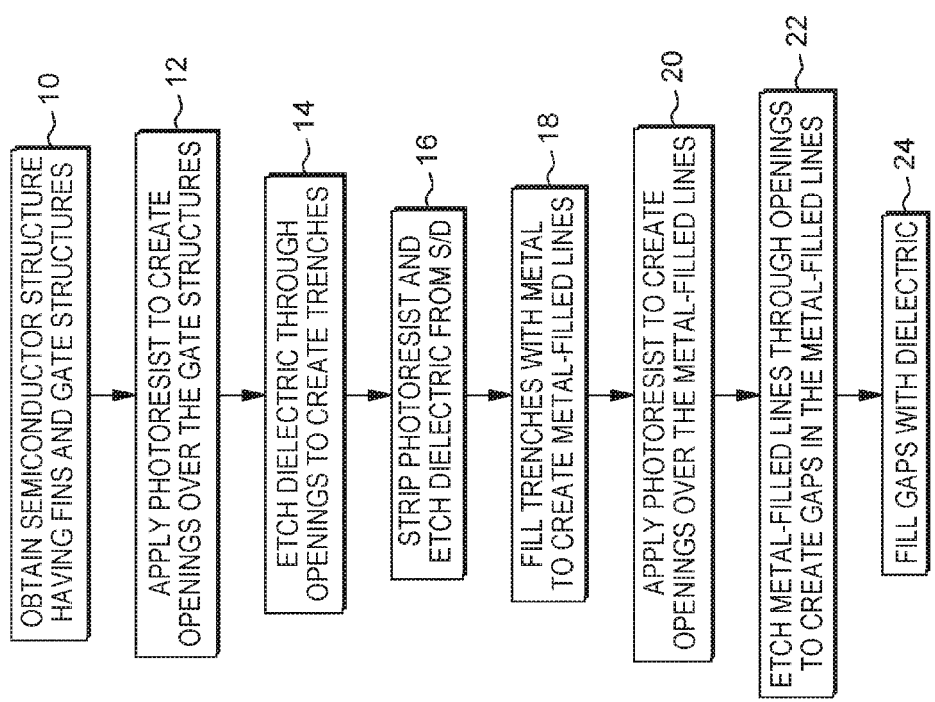
FIG. 9 is a flow chart of the process steps of the exemplary embodiments illustrated in FIGS. 1A, 1B, 1C through FIGS. 8A, 8B, 8C.

A flow chart of the process is also depicted in FIG. 9. The description of FIGS. 1A, B, C through 8A, B, C, D will also make simultaneous reference to FIG. 9.

The exemplary embodiments have applicability to both FinFET and planar structures. For the purpose of illustration and not limitation, the exemplary embodiments will be demonstrated by a FinFET structure.

In a first step of the process, a semiconductor structure 30 having gate structures 32 may be obtained, step 10 in FIG. 9. In the illustrative exemplary embodiment, the semiconductor structure may also include fins 33. FIG. 1A is a plan view of the semiconductor structure 30 having a plurality of fins 33 and a plurality of gate structures 32, FIG. 1B is a cross sectional view of FIG. 1A in the direction of arrows B-B and FIG. 1C is a cross sectional view of FIG. 1A in the direction of arrows C-C. Three fins 33 are shown in FIGS. 1A and 1C. The gate structures 34 may wrap around each of the fins 33 as is conventional for a FinFET device.

Shallow trench isolation 49, best shown in FIG. 1C, may be previously formed parallel to the fins 33 to provide isolation for the devices formed on those fins 33. The shallow trench isolation 49 may be, for example, silicon oxide.

Each of the gate structures 32 includes spacers 34, work function metals 36 and gate metal 38. The gate metal 38 may be, for example, tungsten. The work function metals 36 may be varied depending on whether the gate structure 32 is for a p function device or an n function device. As shown in FIG. 1B as well as the remaining Figures, for the purpose of illustration and not limitation, the work function metals 36 are the same for the gate structures 32 shown in FIG. 1B as well as the remaining Figures. The gate structures 32 may each additionally have a nitride cap 40. The nitride cap 40 may have a thickness of about 30 nm. The gate structures 32 may further include raised source/drains 42. With a plurality of gate structures 32 such as that shown in FIG. 1B, the gate structures 32 may share a common raised source/drain 44.

The semiconductor structure 30 may also include a nitride cap layer 46 that covers the fins 33 and source/drains 42, 44. The nitride cap layer 46 may have a thickness of about 3 to 5 nm. Topping the semiconductor structure 30 may be a dielectric layer 48 such as a silicon oxide.

In one exemplary embodiment, the shallow trench isolation 49 and the dielectric layer 48 may be made of the same insulating material such as, for example, silicon oxide. It is within the scope of the exemplary embodiments for the shallow trench isolation 49 and the dielectric material to be made from different insulating materials.

Figures 3A, 3B, 3C:
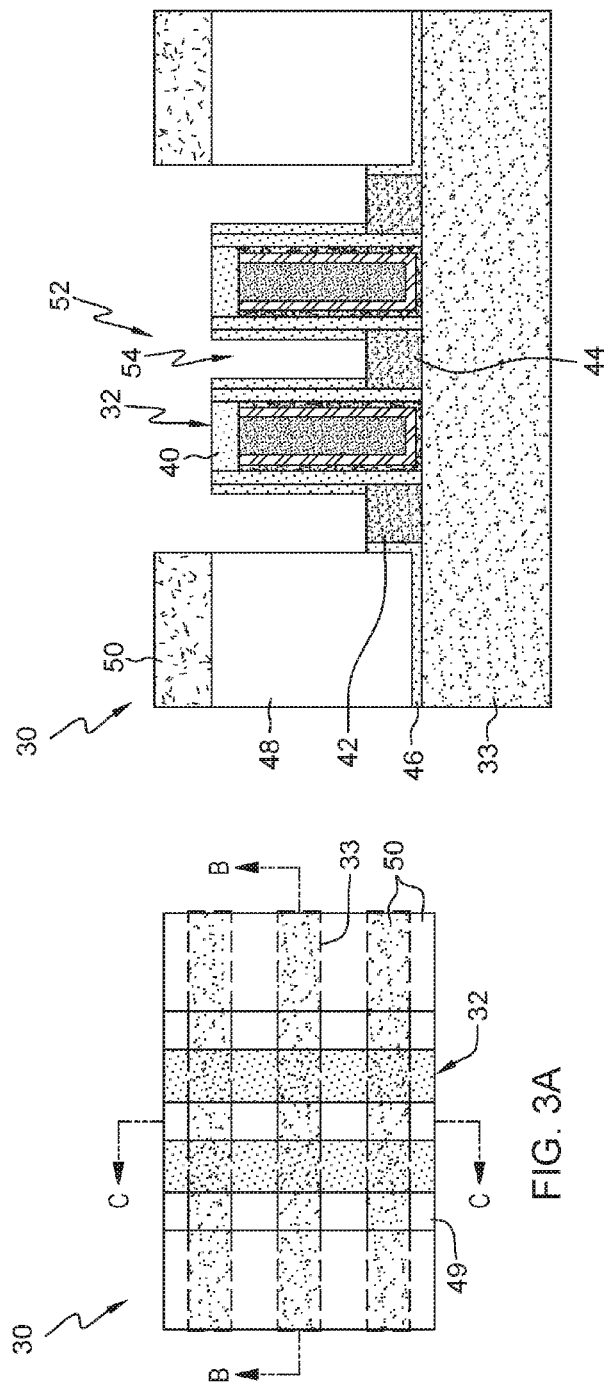
FIG. 3A is a plan view of the semiconductor structure of FIG. 2A in which the semiconductor structure has been etched through the opening over the plurality of gate structures to remove dielectric material adjacent to the plurality of gate structures to create trenches.
FIG. 3B is a cross sectional view of FIG. 3A in the direction of arrows B-B and FIG. 3C is a cross sectional view of FIG. 3A in the direction of arrows C-C.

In a next step, photoresist 50 may be applied to create openings 52 over the gate structures, step 12 FIG. 9. Referring now to FIGS. 2A, 2B and 2C, FIG. 2A is a plan view of the semiconductor structure 30 of FIG. 1A in which the photoresist 50 has been applied and developed to create openings 52 (one of which is shown in FIG. 3B) over the plurality of gate structures 32, FIG. 2B is a cross sectional view of FIG. 2A in the direction of arrows B-B and FIG. 2C is a cross sectional view of FIG. 2A in the direction of arrows C-C.

The dielectric 48 may be etched through the openings 52 to create trenches 54 that run parallel to the gate structures 32, step 14 FIG. 9. Referring now to 3A, 3B and 3C, FIG. 3A is a plan view of the semiconductor structure 30 of FIG. 2A in which the semiconductor structure 30 has been etched through the openings 52 over the plurality of gate structures 32 to remove dielectric material 48 adjacent to the plurality of gate structures 32 to create trenches 54, FIG. 3B is a cross sectional view of FIG. 3A in the direction of arrows B-B and FIG. 3C is a cross sectional view of FIG. 3A in the direction of arrows C-C. The nitride cap layer 46 that covers the sources/drains 42, common source/drain 44 and shallow trench isolation 49 is also removed by etching so as to expose the sources/drains 42, 44 and the shallow trench isolation 49. Since the nitride cap layer 46 is much thinner than the nitride cap layer 40 over the gate structures 32, the nitride cap layer 40 will only be etched to a small degree when the nitride cap layer 46. The sources/drains 42, 44 are exposed so that in a subsequent process step, metal contacts will be formed that may make direct electrical and physical contact with the sources/drains 42, 44. The trenches 54 that are formed are preferably directly adjacent to the gate structures 32.

After the trenches are formed, the photoresist 50 may be conventionally stripped, step 16 FIG. 9. FIG. 4A is a plan view of the semiconductor structure of FIG. 3A in which the photoresist 50 has been removed from the semiconductor structure 30, FIG. 4B is a cross sectional view of FIG. 4A in the direction of arrows B-B and FIG. 4C is a cross sectional view of FIG. 4A in the direction of arrows C-C.

The trenches 54 between the gate structures 32 are filled with metal to create metal-filled lines 56, step 18 FIG. 9. FIG. 5A is a plan view of the semiconductor structure of FIG. 4A in which the trenches 54 between the gate structures 32 created in FIGS. 3A, 3B and 3C have been filled with the metal to create metal-filled lines 56, FIG. 5B is a cross sectional view of FIG. 5A in the direction of arrows B-B and FIG. 5C is a cross sectional view of FIG. 5A in the direction of arrows C-C. The metal that fills the trenches 54 may first include a liner 58 of titanium/titanium nitride or tantalum/tantalum nitride followed by tungsten or cobalt 60. The metal-filled lines 56 may directly contact the cap liner 46, if present, or the spacers 34 if the cap liner 46 is not present. The metal-filled lines 56 may also directly contact the sources/drains 42, 44. The shallow trench isolation 49 may also be directly contacted by the metal-filled lines 56 as best shown in FIG. 5C.

Photoresist 62 may be deposited and developed to create openings 64 over the metal-filled lines 56, step 20, FIG. 9. FIG. 6A is a plan view of the semiconductor structure 30 of FIG. 5A in which the photoresist 62 has been applied and developed to create the openings 64 over the metal-filled lines 56, FIG. 6B is a cross sectional view of FIG. 6A in the direction of arrows B-B and FIG. 6C is a cross sectional view of FIG. 6A in the direction of arrows C-C.

The metal-filled lines 56 are etched through the openings 64 to create gaps 66, 67 in the metal-filled lines 56, step 22, FIG. 9. FIG. 7A is a plan view of the semiconductor structure 30 of FIG. 6A in which the metal-filled lines 56 have been etched through the openings 64 created in FIGS. 6A, 6B and 6C to create the gaps 66, 67 in the metal-filled lines, FIG. 7B is a cross sectional view of FIG. 7A in the direction of arrows B-B, FIG. 7C is a cross sectional view of FIG. 7A in the direction of arrows C-C and FIG. 7D is a cross sectional view of FIG. 7A in the direction of arrows D-D. All of the metal-filled line 56 has been removed in the gaps 66, 67. Gaps 66 are formed over the sources/drains 42, 44 so that now the sources/drains 42, 44 may be exposed through the gaps 66. Gaps 67 are formed over the shallow trench isolation 49 so that now the shallow trench isolation 49 may be exposed through the gaps 67.

FIGS. 7A to 7D illustrate that the tip-to-tip features are not only formed on the sources/drains 42, 44 but also on the shallow trench isolation regions 49. In one exemplary embodiment, the majority of the tip-to-tip features may be formed on the shallow trench isolation 49.

The gaps 66, 67 are filled with a dielectric material 68, such as silicon oxide, step 24, FIG. 9. FIG. 8A is a plan view of the semiconductor structure 30 of FIG. 7A in which the gaps 66, 67 in the metal-filled lines 56 created in FIGS. 7A, 7B, 7C and 7D have been filled with the dielectric material 68, FIG. 8B is a cross sectional view of FIG. 8A in the direction of arrows B-B, FIG. 8C is a cross sectional view of FIG. 8A in the direction of arrows C-C and FIG. 8D is a cross sectional view of FIG. 8A in the direction of arrows D-D. As best shown in FIG. 8A, the ends 70 of each of the metal-filled lines 56 are well-defined which allows for greater scaling.

Figure 10A:
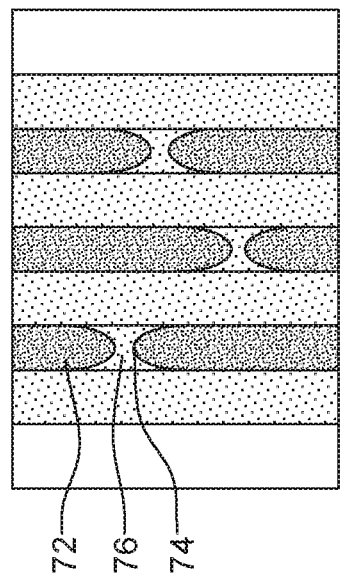
FIG. 10A is a reproduction of FIG. 8A
Figure 10B:
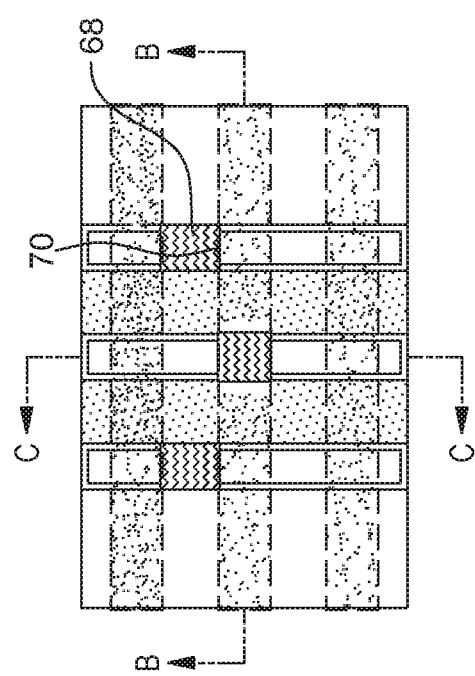
FIG. 10B is a view similar to FIG. 10A of a prior structure having less desirable tip-to-tip spacing.

The improvement over prior processes is demonstrated in FIG. 10A compared to FIG. 10B. FIG. 10A is a reproduction of FIG. 8A which again shows the well-defined ends 70 of the metal-filled lines 56. FIG. 10B shows a structure produced by a prior process in which the dielectric filled contact holes 76 are formed first followed by the formation of the metal-filled lines 72. Such a process is more difficult to control and less manufacturable and the metal-filled lines 72 have rounded ends 74 which are less well-defined and make scaling to smaller dimensions difficult.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. An interconnect structure comprising:
   a semiconductor structure on a semiconductor substrate, the semiconductor structure having a gate structure, shallow trench isolation and a source and a drain;
   a trench adjacent to the gate structure;
   a metal line adjacent to the gate structure and filling the trench, the metal line contacts one of the source and the drain;
   a gap in the metal line so as to create segments of the metal line; and
   a dielectric material filling the gap such that ends of the metal line abut the dielectric material wherein the ends of the metal line have a flat surface.

2. The interconnect structure of claim 1 wherein the source and the drain are each a raised source and a raised drain.

3. The interconnect structure of claim 1 wherein the metal line directly contacts the one of the source and the drain.

4. The interconnect structure of claim 1 wherein the metal line is tungsten or cobalt.

5. The interconnect structure of claim 1 wherein the dielectric material filling the gap contacts the shallow trench isolation.

6. The interconnect structure of claim 1 wherein the dielectric material filling the gap directly contacts the shallow trench isolation.

7. The interconnect structure of claim 1 wherein the semiconductor structure is a planar structure.

8. The interconnect structure of claim 1 wherein the semiconductor structure is a FinFET structure.

9. An interconnect structure comprising:
   a semiconductor structure on a semiconductor substrate, the semiconductor structure having a plurality of gate structures, shallow trench isolation separating the plurality of gate structures and each gate structure having a source and a drain;
   a trench adjacent to each of the plurality of gate structures;
   a metal line adjacent to each of the plurality of gate structures and filling the trench, the metal line contacts one of the source and the drain of the plurality of gate structures;
   a gap in each metal line so as to create segments of the each metal line; and
   a dielectric material filling the gap in each metal line such that ends of the each metal line abut the dielectric material wherein the ends of the each metal line have a flat surface.

10. The interconnect structure of claim 9 wherein the source and the drain of each gate structure are each a raised source and a raised drain.

11. The interconnect structure of claim 9 wherein the metal line adjacent to each of the plurality of gate structures directly contacts the one of the source and the drain of the plurality of gate structures.

12. The interconnect structure of claim 9 wherein the metal line is tungsten or cobalt.

13. The interconnect structure of claim 9 wherein the dielectric material filling the gap in some of the plurality of the metal lines contacts the shallow trench isolation.

14. The interconnect structure of claim 9 wherein the dielectric material filling the gap in some of the plurality of the metal lines directly contacts the shallow trench isolation.

15. The interconnect structure of claim 9 wherein the dielectric material filling the gap in each of the metal lines contacts the source or drain of some of the plurality of gate structures.

16. The interconnect structure of claim 9 wherein the dielectric material filling the gap in each of the metal lines directly contacts the source or drain of some of the plurality of gate structures.

17. The interconnect structure of claim 9 wherein the semiconductor structure is a planar structure.

18. The interconnect structure of claim 9 wherein the semiconductor structure is a FinFET structure.

* * * * *